United States Patent [19]
Leveque

[11] Patent Number: 5,828,543
[45] Date of Patent: Oct. 27, 1998

[54] INTEGRATED CONTROL AND PANEL ASSEMBLY WITH IMPROVED TERMINATIONS

[76] Inventor: Denis J. Leveque, 9612 W. Vera Ave., Milwaukee, Wis. 53224

[21] Appl. No.: 799,592

[22] Filed: Feb. 10, 1997

[51] Int. Cl.[6] .................................................. H02B 1/04
[52] U.S. Cl. ........................... 361/637; 29/832; 361/775
[58] Field of Search .................................. 439/55, 59–64, 439/212, 214, 723, 839; 361/627, 631, 632, 634, 637, 639, 640, 641, 644, 648, 650, 772, 774, 775, 813; 200/292, 294–296; 29/832; 248/842, 847, 27.1

[56] References Cited

U.S. PATENT DOCUMENTS

| | | | |
|---|---|---|---|
| 4,869,673 | 9/1989 | Kreinberg | 361/775 |
| 4,886,227 | 12/1989 | Matl | 361/807 |
| 5,229,922 | 7/1993 | Muramatsu | 361/648 |
| 5,300,917 | 4/1994 | Maue | 361/648 |

*Primary Examiner*—Gerald P. Tolin
*Attorney, Agent, or Firm*—Terrence (Terry) Martin; Jules Jay Morris; David Barron

[57] ABSTRACT

A planar array of electric conductors is stamped from a sheet of conductive material and has tabs for each of the conductors bent outwardly of the plane of the material. The conductors are interconnected by a plurality of webs and are affixed to a dielectric carrier sheet by an adhesive, whereupon the webs are severed and the conductors have electrical isolation. The carrier sheet and conductors are attached to a control panel and electric control devices are attached to the control panel over the conductors. The control devices are provided with terminals that extend in the same direction as the tabs of the conductors, and the control devices are electrically connected to the conductors by double ended push-on preformed connectors.

13 Claims, 5 Drawing Sheets

INTEGRATED CONTROL AND PANEL ASSEMBLY WITH IMPROVED TERMINATIONS

BACKGROUND OF THE INVENTION

The present invention relates to control panels having integrally associated therewith a control device and particularly a device for electrically controlling the operation of remotely located servo actuators for performing an appliance control function. Such panel assemblies are utilized in household appliances such as clothes washing machines, clothes dryers and dishwashers. Heretofore, the user control panel for such appliances has utilized discrete control devices such as programmers/timers, pressure switches, electrically operated water valves, and other control devices attached to a control panel which is in turn attached to the cabinet or housing for the appliance and more commonly on a control console. The control devices typically have a user operated control shaft extending through an aperture in the control panel with a knob or lever or similar actuator attached thereto from the exterior of the control console so as to be accessible to the user. The particular control devices mounted on the panel are discretely wired to the servo actuators by individual conductors through a wiring harness which typically extends from the interior of the control console into the main cabinet or housing for the appliance. This arrangement has proven to be costly in mass production of household appliances in terms of complexity and the time required for assembly of the plurality of individual electrical wire leads and connectors required for hook-up of the control devices to the appliance wiring harness.

It has thus been desired to provide a way or means of assembling control devices to a control panel for an electrically operated appliance which is relatively low in manufacturing cost and is simple to assemble during manufacture of the appliance and is reliable in service.

SUMMARY OF THE INVENTION

It is an object of the present invention to provide a simple, easy to assemble and relatively low-cost control panel for an electrically operated appliance with the control panel having user actuated electrical control devices thereon for effecting and controlling various appliance functions during the operating cycle of the appliance.

It is a further object of the present invention to provide an integrated control and panel assembly having electrical conductors integrally assembled therewith and with integral tab terminals on the conductors readily connected to terminals on the control devices by double-ended plug-on connectors.

The present invention comprises a plastic control panel deck to which a conductor subassembly and various control devices are attached. A plurality of conductors interconnected by frangible webs are stamped in a planar arrangement from a single sheet or strip of electrically conductive material. The stamped sheet is provided with a plurality of tabs, at least one for each conductor, which are bent outwardly of the plane of the sheet of electrically conductive material. The stamped and bent conductive sheet is attached to a thin flexible dielectric carrier sheet and the webs are punched out to provide discrete electrically isolated conductors on the carrier sheet. The integral bent tabs extend in a common direction away from the carrier sheet and away from the deck. The carrier sheet and deck have complementary shaped structures for effecting snap-on attachment of the conductor subassembly to the deck as well as aligned openings for the receipt of control devices which are assembled from the conductor subassembly side, through the conductor subassembly and through the deck to attach to the deck. The control devices are provided with plug-on terminals which extend in the common direction of the integral bent tab terminals of the conductors. Double-ended connectors having plug-on type complementary terminals at the opposite ends are used to electrically connect a control device to a conductor of the conductor subassembly.

DETAILED DESCRIPTION OF THE PREFERRED EMBODIMENTS

Figure 1:
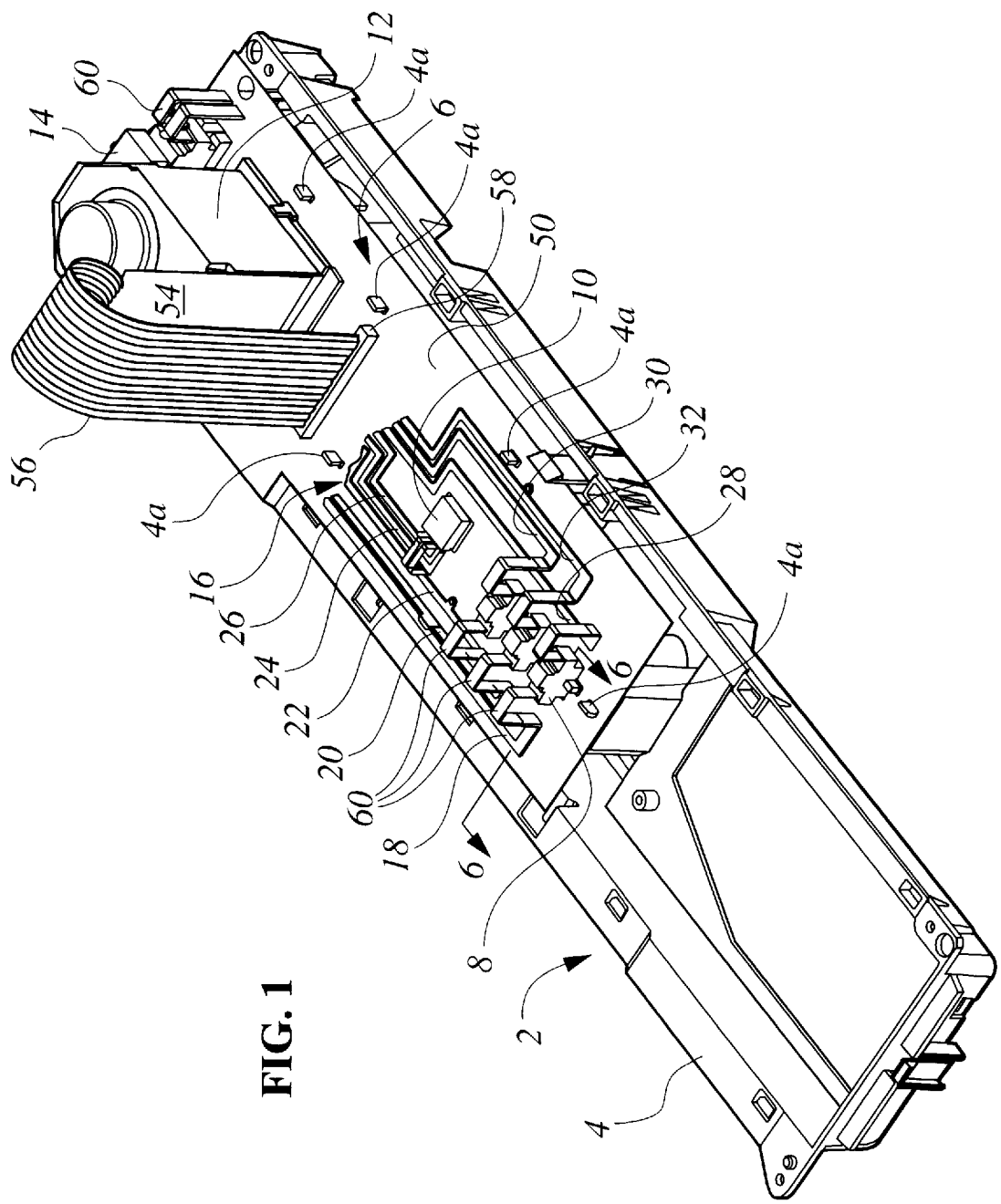
FIG. 1 is an axonometric view of the assembly of the present invention.
Figure 2:
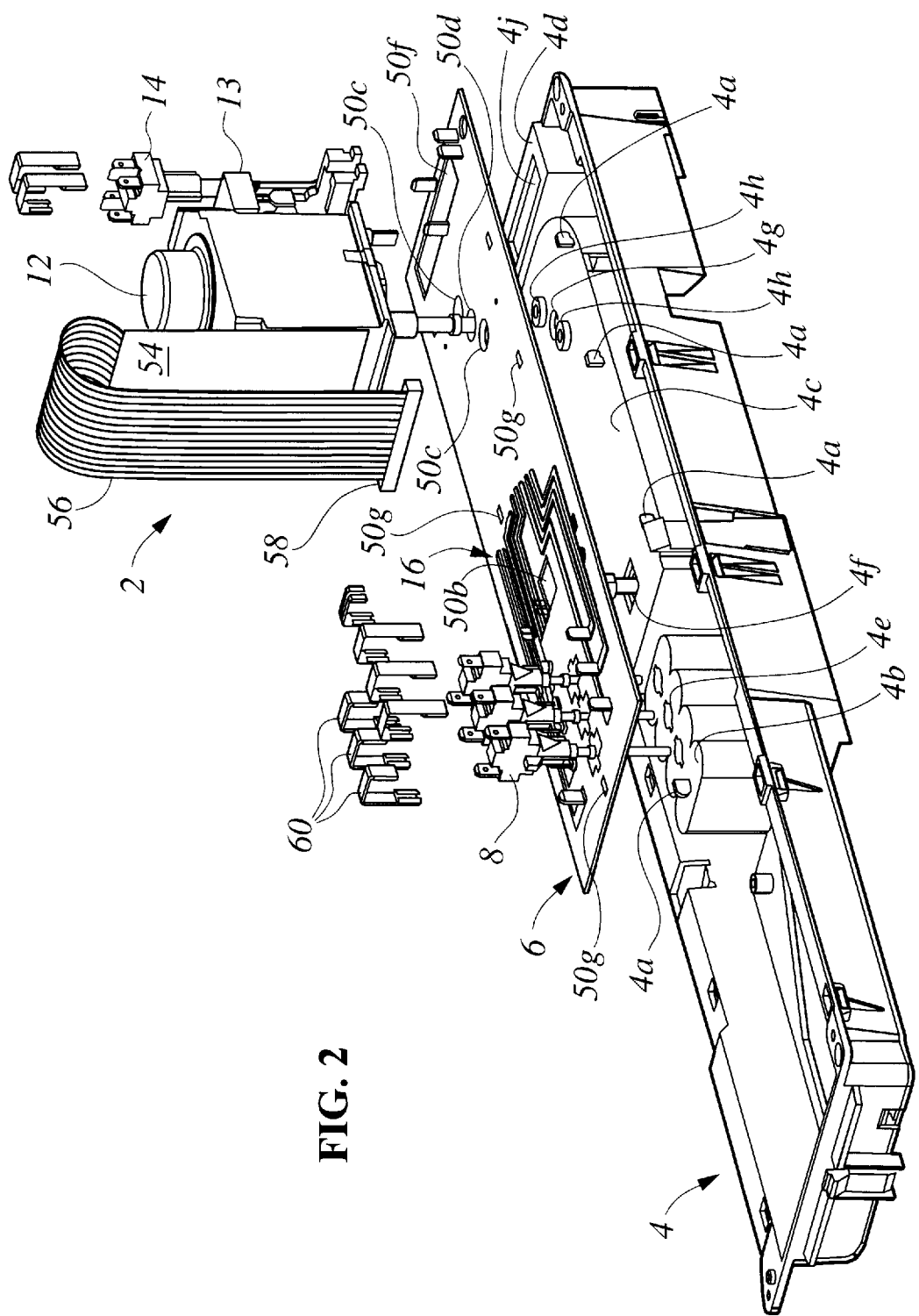
FIG. 2 is an axonometric exploded view of the assembly of FIG. 1.
Figure 3:
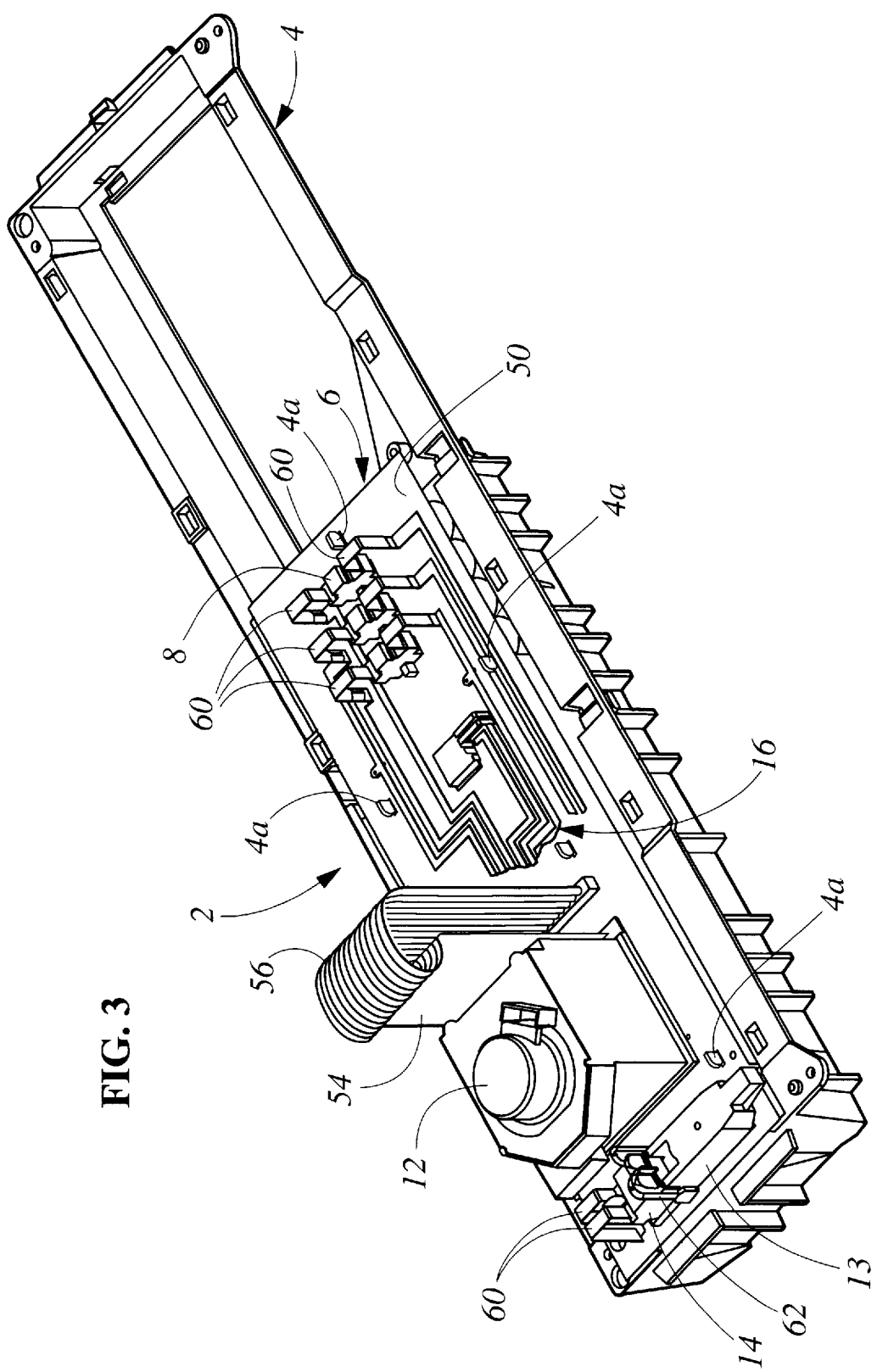
FIG. 3 is an axonometric view of the assembly of the present invention similar to FIG. 1 but viewing the assembly from an opposite end.
Figure 4:
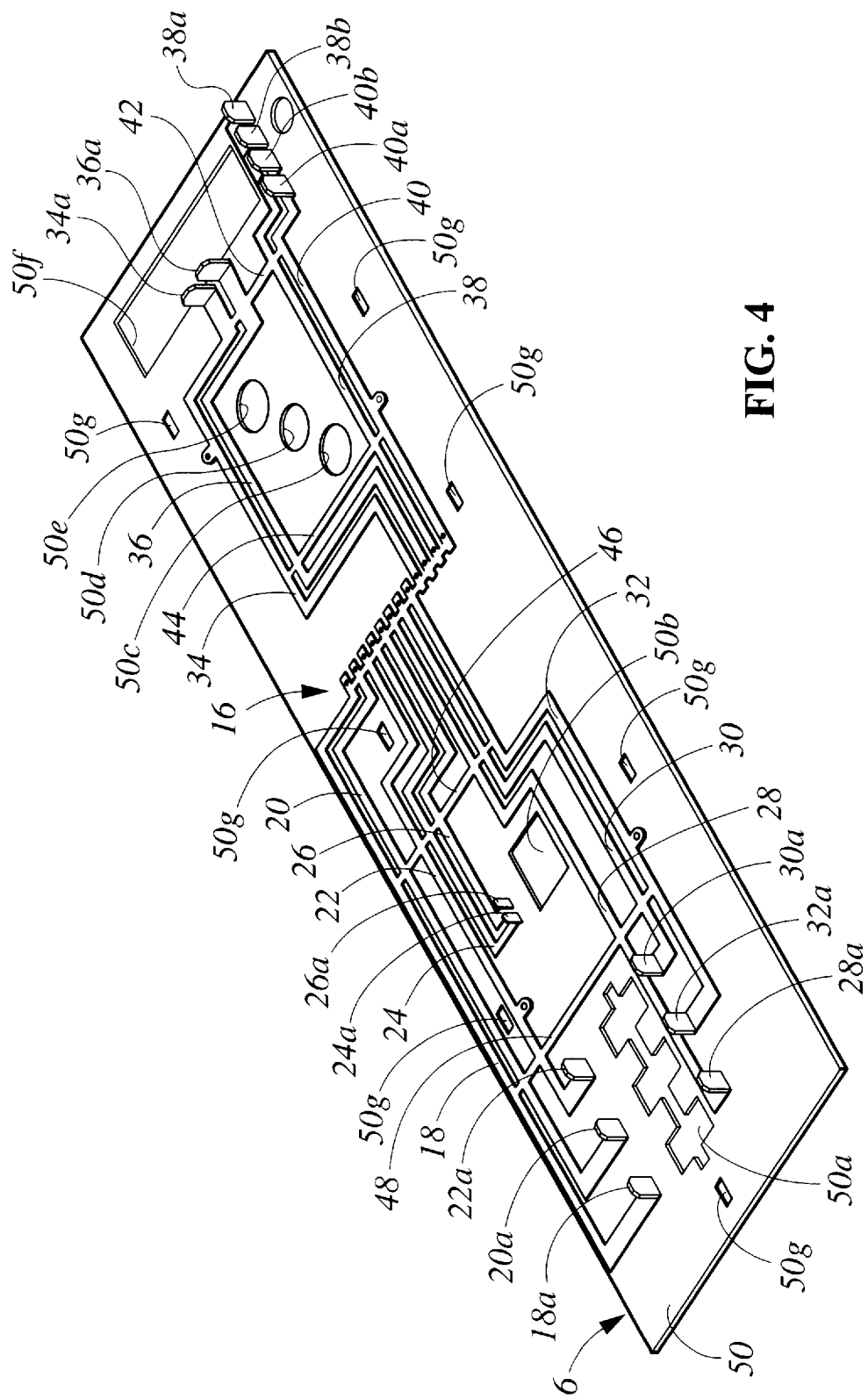
FIG. 4 is an axonometric view of the conductor subassembly of this invention.

Referring to FIGS. 1, 2 and 3 of the drawings, the integrated control and panel assembly with improved terminations of the present invention is generally indicated at 2 and includes a molded dielectric control panel deck or escutcheon 4 to which is attached a conductor subassembly 6 and a plurality of control devices 8, 10, 12, 13 and 14. The conductor subassembly 6 is generally constructed according to the teachings of copending patent application Ser. No. 08/695,487 filed Aug. 12, 1996 entitled "Integrated Control and Panel Assembly", in the names of D. J. Leveque and J. R. Jaeschke, and assigned to the assignee of this invention. As best seen in FIG. 4, a conductor sheet generally indicated at 16 is formed by stamping or perforating an elongated relatively thin sheet or strip of conductive material to comprise individual or discrete conductor strips 18 through 40 which are interconnected by transverse webs 42 through 48 spaced preferably in a generally parallel planar array. Each of the respective conductor strips has at least one integral tab 18a through 36a and in the case of conductors 38 and 40, two tabs 38a and 38b and 40a and 40b are provided, respectively. The integral tabs are bent upwardly out of the plane of the conductor sheet 16 and extend in a common direction. The stamped array of conductors is attached adhesively to a relatively thin flexible dielectric sheet 50. Thereafter, the transverse webs 42 through 48 are frangibly removed by any convenient expedient as, for example, punching or stamping, leaving the individual discrete conductor strips electrically isolated from each other. The integral tab bent terminals provide an economically manufactured assembly by reducing the number of separate parts required and simplifying the assembly operation. It will also be appreciated that the integral tab construction eliminates an electrical joint to improve conductivity.

Dielectric sheet 50 is preferably formed of an acrylic plastic material, however other suitable dielectric materials may be used. The sheet 50 has a relatively small thickness in the range of 0.020–0.030 inches (0,5–0,76 mm) relative to its width or length dimensions which affords the sheet a particular flexibility. Attachment of the conductor sheet 16 to the dielectric sheet 50 by a suitable adhesive provides some additional rigidity to the subassembly, but does not completely remove the flexibility. Sheet 50 is provided with a plurality of openings such as 50*a,* 50*b,* 50*c,* 50*d,* 50*e,* and 50*f* as seen in FIG. 4. As will be described hereinafter, the openings 50*a* through 50*f* are provided for control devices which will be mounted to the integrated assembly of this invention. A second set of openings comprising a plurality of rectangular slots 50*g* is provided in dielectric sheet 50 for attachment of the conductor subassembly 6 to the deck 4 which is provided with a plurality of corresponding upstanding projections 4*a.*

Referring particularly to FIG. 2, deck 4 may be seen to comprise a plurality of structural shapes, each of which have a rearwardly facing surface 4*b,* 4*c* and 4*d,* all disposed in a common plane. Surface 4*b* is provided with openings 4*e* for the control switches 8; surface 4*c* is provided with a rectangular opening 4*f* for the potentiometer 10 and opening 4*g* for the user operated control shaft of a programmer/timer 12. A pair of circular bosses 4*h* are disposed on opposite sides of opening 4*g* on surface 4*c* for effecting proper alignment of device 12. A large rectangular opening 4*j* is provided in the surface 4*d* through which the operator shafts of pushbuttons 13 and 14 extend. As seen in FIG. 2, the conductor subassembly is aligned over the rear surface of deck 4 comprising coplanar surfaces 4*b,* 4*c* and 4*d* such that the secondary openings 50*g* are aligned with the projections 4*a* to position and retain the conductor assembly attached to the rear surface of deck 4. When so assembled, the openings 50*a* through 50*f* align with the respective openings 4*e* through 4*j,* and that the bosses 4*h* project upwardly through the openings 50*c* and 50*e.* It is to be noted that conductor sheet 16 is only partially shown in FIGS. 1, 2 and 3 to simplify the illustration.

Figure 6:
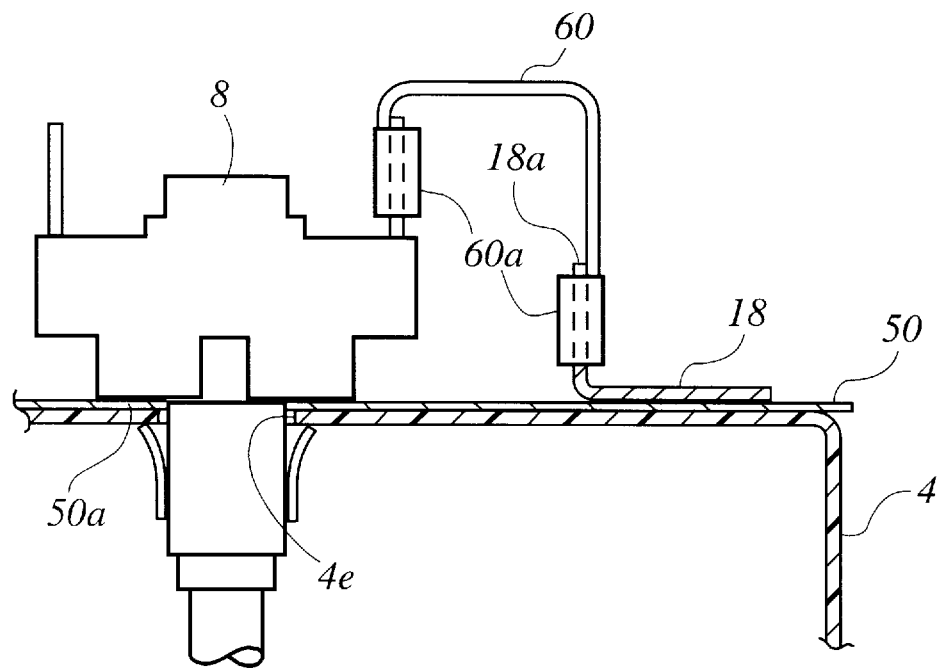
FIG. 6 is a section view taken along the line 6—6 in FIG. 1

Referring particularly to FIG. 6, once the conductor subassembly 6 is attached to the deck 4, the various control devices may be assembled. Switches 8, which are pushbutton switches but may also be rotary switches, have actuator shafts or plungers which extend through openings 50*a* in dielectric carrier sheet 50 and 4*e* in deck 4, to the front of the deck. The housing of each switch 8 is provided with snap-in retention means which extends through the openings 50*a* and 4*e* and grips the opposite side of the deck 4 to mount the respective switch 8 to the deck panel 4, entrapping it firmly against the carrier sheet 50. Potentiometer 10 has a rotary shaft extending forwardly through the aligned openings 50*b* and 4*f* in dielectric sheet 50 and deck 4, respectively. This control device is also provided with means to snap-fit attach the housing to the deck 4. A programmer timer 12 has a rotatable control shaft which projects through the aligned openings 50*d* and 4*g* in the carrier sheet 50 and deck 4, respectively. Although not shown, the control device 12 is attached to the control assembly by screws from the front of the assembly. A speed control circuit board 54 is attached to the programmer/timer 12 and is electrically connected to the conductive strips 18 through 40 by a flexible flat ribbon conductor 56 having a pin-type connector 58 attached to the conductive strips. Finally, a pair of pushbutton switches 13 and 14 are attached to deck 4 at surface 4*d.* Each pushbutton switch has an operator plunger which extends through the aligned openings 50*f* and 4*j* in the carrier sheet 50 and deck 4, respectively.

Figure 5:
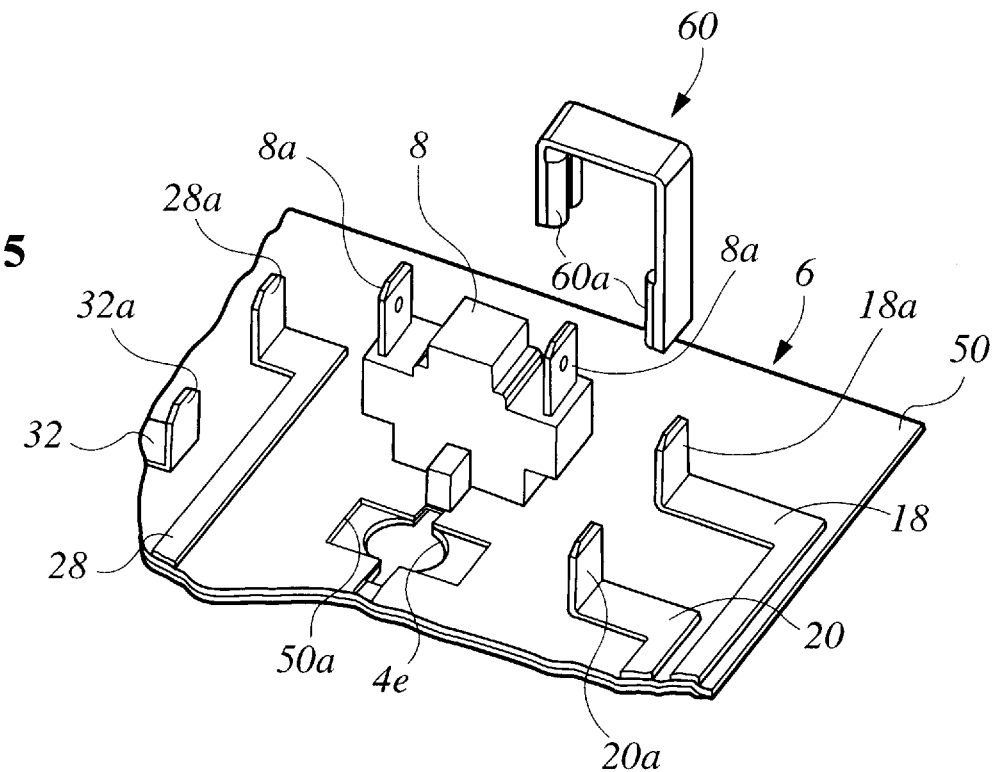
FIG. 5 is an axonometric view of a fragmentary portion of the assembly of this invention with a connector exploded therefrom.

As can be particularly seen in FIGS. 2 and 5, the control devices have plug-in type terminals such as 8*a* for pushbutton switches 8, that extend in the common direction of integral terminal tabs 18*a* through 40*b.* The control devices may be readily connected, according to this invention, to the conductors 18–40 by double ended connectors such as 60 and 62. As seen in FIG. 3, connector 62 comprises a pair of female type spade connector clips joined by a length of flexible wire for attachment at opposite ends to the pushbutton switch 13 and to the terminal tabs 34*a,* 36*a.* Such connectors may be used throughout the assembly, however it is preferred to use a preformed connector 60 such as is particularly shown in FIG. 5. Connector 60 is a rigid preformed conductor preferably having integral spring-type spade retention clips 60*a* formed at each end. The preformed connectors 60 dimensionally vary so that the opposite ends are particularly aligned with the respective integral tabs of the conductor strips and with the control device terminal. Electrical connection is therefore facilitated by merely pushing the preformed connector in a single direction over the respective associated terminal tabs.

The invention described herein provides an economically and easily assembled integrated control and panel assembly providing improved termination and electrical connection between a conductor strip and the control devices. The completed assembly can then readily be further assembled into the control console of an appliance such as a washing machine or the like. Although the invention has been described in a preferred embodiment, it is to be recognized that it is susceptible of various modifications without departing from the scope of the appended claims.

I claim:

1. An integrated control and panel assembly comprising:
   (a) an elongated deck member formed of dielectric material and having a plurality of openings therein;
   (b) a conductor subassembly comprising:
      (i) a carrier sheet formed of dielectric material having a thickness relatively small with respect to its width and having a plurality of openings therein;
      (ii) a unitary planar strip formed of conductive material having a plurality of spaced generally parallel conductors, adjacent ones of said conductors being interconnected by webs formed therebetween;
      (iii) each of said conductors comprising at least one integral tab bent to project out of a plane containing said conductors to provide a terminal for each respective said conductor, said unitary strip being disposed on said carrier sheet with said webs removed to provide electrical isolation of said conductors;
   (c) said conductor sub-assembly being disposed on a surface of said deck member with said openings in said carrier sheet aligned with said openings in said deck member;
   (d) at least one electrically operated control device disposed over said carrier sheet and mounted to said deck member through said aligned openings in said carrier sheet and said deck member, said control device having at least a pair of tab-type electric terminals projecting therefrom, said control device terminals and said integral tabs of said conductor extending in a common direction; and
   (e) a plurality of connectors attached to respective said control device terminals and said conductor tabs.

2. The assembly defined in claim 1, wherein said connectors comprise plug-on terminals at respective opposite ends for plug-on attachment to said control device terminals and said conductor tabs.

3. The assembly defined in claim 2, wherein said connectors comprise preformed rigid conductive straps.

4. The assembly defined in claim 3, wherein said plug-on terminals are formed integrally with said conductive strap.

5. The assembly defined in claim 4, wherein said deck member comprises a plurality of upstanding projections engaging said carrier sheet for attaching said carrier sheet to said deck member.

6. The assembly defined in claim 5, wherein said carrier sheet comprises a second plurality of openings for receiving said deck member projections.

7. A method of making an integrated control and panel assembly comprising:

(a) perforating a relatively thin planar strip of conductive material and forming a plurality of discrete conductors interconnected by webs;

(b) bending at least one tab portion of each said discrete conductor out of the plane of said strip;

(c) attaching said strip to a relatively thin flexible dielectric carrier sheet with said tabs extending away from said carrier sheet;

(d) removing said webs and electrically isolating said conductors;

(e) forming a dielectric deck having openings therein and attaching said dielectric carrier sheet and said attached conductors to said deck with said tabs extending away from said deck;

(f) attaching a control device to said deck;

(g) forming a connector with push-on terminal clips at opposite ends; and (h) connecting a terminal of said control device to a said bent tab of said conductor by pushing said clips in a common direction onto said terminal and to said tabs.

8. The method of defining in claim 7, wherein said step of attaching said control device includes providing openings in said carrier sheet in correspondence with said openings in said deck, and inserting a portion of said control device through said corresponding openings.

9. The method of defining in claim 7, wherein said step of attaching at least one control device includes inserting a user operated control shaft through said deck and said carrier sheet.

10. The method of defining in claim 7, wherein said step of forming a plurality of discrete conductors includes forming said conductors in a spaced generally parallel array.

11. The method of defining in claim 7, wherein said step of forming a deck includes molding thermoset plastic material.

12. The method of defining in claim 7, wherein said step of removing said webs includes frangibly removing.

13. The method of defining in claim 7, wherein said step of attaching said unitary strip to said dielectric sheet includes adhesively bonding.

\* \* \* \* \*